(12) United States Patent
Chen et al.

(10) Patent No.: US 6,723,201 B2
(45) Date of Patent: Apr. 20, 2004

(54) MICROCHIP FABRICATION CHAMBER WAFER DETECTION

(75) Inventors: Wen-Ming Chen, Miaoli (TW); Wen-Chi Wang, Chu-Nan (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 110 days.

(21) Appl. No.: 10/081,665

(22) Filed: Feb. 21, 2002

(65) Prior Publication Data

US 2003/0155080 A1 Aug. 21, 2003

(51) Int. Cl.[7] .......................... H01L 21/00; C23C 16/00
(52) U.S. Cl. .................. 156/345.24; 118/715; 118/500
(58) Field of Search ............. 156/345.24; 118/715–733, 118/500

(56) References Cited

U.S. PATENT DOCUMENTS

| 6,150,638 A | * | 11/2000 | Strodtbeck et al. | ......... 219/502 |
| 6,592,673 B2 | * | 7/2003 | Welch et al. | ............... 118/676 |

FOREIGN PATENT DOCUMENTS

| JP | 05129421 A | * | 5/1993 | .......... H01L/21/68 |
| JP | 10160420 A | * | 6/1998 | .......... G01B/11/06 |
| JP | 11069855 A | * | 3/1999 | .......... H02N/13/00 |
| JP | 11214484 A | * | 8/1999 | .......... H01L/21/68 |

* cited by examiner

*Primary Examiner*—Gregory Mills
*Assistant Examiner*—Ram N Kackar
(74) *Attorney, Agent, or Firm*—Tung & Associates

(57) ABSTRACT

A microchip fabrication chamber has a pedestal adapted to retain a wafer during processing steps conducted within the chamber. A lift mechanism including a plurality of lift mechanism pins engages and disengages a wafer to the pedestal. A sensor associated with the tip of at least one of the lift mechanism pins detects the presence of the wafer.

6 Claims, 3 Drawing Sheets

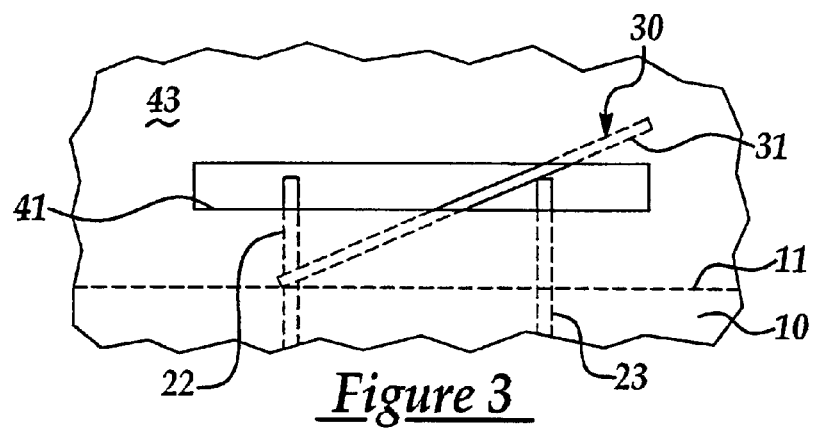
*Figure 3*
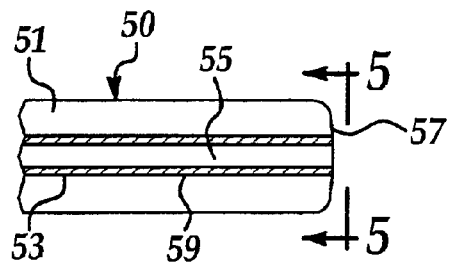
*Figure 4*
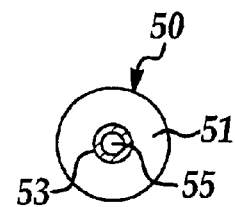
*Figure 5*
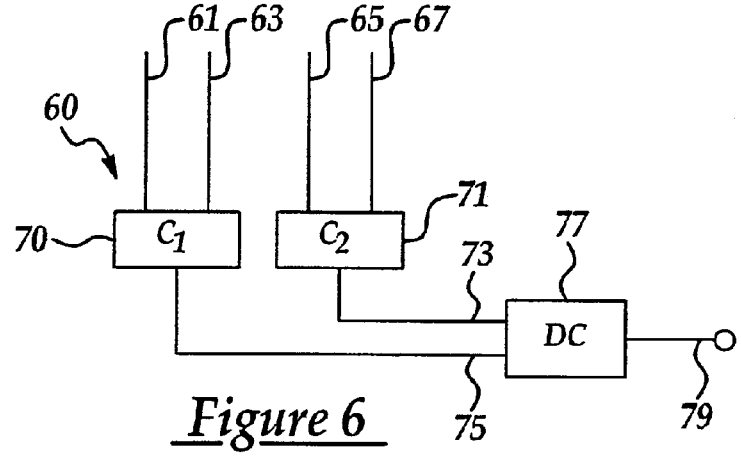
*Figure 6*
| WAFER STATUS | P1 | P2 | P3 | P4 | FAULT |
|---|---|---|---|---|---|
| MISSING/BROKEN | 0 | 0 | 0 | 0 | 1 |
| MISPOSITIONED | 0 | X | X | X | 1 |
| MISPOSITIONED | X | 0 | X | X | 1 |
| MISPOSITIONED | X | X | 0 | X | 1 |
| MISPOSITIONED | X | X | X | 0 | 1 |
| PROPER | 1 | 1 | 1 | 1 | 0 |
*Figure 7*

| WAFER STATUS | C1 | C2 | DC |
|---|---|---|---|
| BROKEN/MISSING | 0 | 0 | 1 |
| MISPOSITIONED | 0 | 1 | 1 |
| | 1 | 0 | 1 |
| PROPER | 1 | 1 | 0 |

| WAFER STATUS | P1 | P2 | P3 | P4 | FAULT |
|---|---|---|---|---|---|
| MISSING/BROKEN | 0 | 0 | 0 | 0 | 1/1 |
| MISPOSITIONED (OFF 2 PINS) | 0 | 0 | X | X | 1/0 |
| MISPOSITIONED (OFF 1 PIN) | 0 | 1 | 1 | 1 | 0/1 |
| MISPOSITIONED (OFF 2 PINS) | X | 0 | 0 | X | 1/0 |
| MISPOSITIONED (OFF 1 PIN1) | 1 | 0 | 1 | 1 | 0/1 |
| MISPOSITIONED (OFF 2 PINS) | X | X | 0 | 0 | 1/0 |
| MISPOSITIONED (OFF 1 PIN) | 1 | 1 | 0 | 1 | 0/1 |
| MISPOSITIONED (OFF 2 PINS) | 0 | X | X | 0 | 1/0 |
| MISPOSITIONED (OFF 1 PIN) | 1 | 1 | 1 | 0 | 0/1 |
| PROPER | 1 | 1 | 1 | 1 | 0/0 |

MICROCHIP FABRICATION CHAMBER WAFER DETECTION

TECHNICAL FIELD

The present invention is generally related to microchip fabrication. More particularly, the invention relates to process controls and equipment related to certain chamber dependant fabrication steps.

BACKGROUND OF THE INVENTION

In microchip fabrication, processing chambers are used in accomplishing various fabrication steps performed on a wafer. For example, among the numerous variety of steps are the non-exhaustive examples of annealing, cleaning, chemical vapor deposition, oxidation, and nitridation.

Chambers generally comprise a substantially planar and horizontal pedestal upon which the wafer rests during the processing within the chamber. The pedestal may also be known as a platen, stage or susceptor. A lift mechanism comprising pins which breach the pedestal from underneath provides a controlled disengagement from, and engagement of the wafer to, the pedestal surface. Wafers are transferred into and out of the chamber, and onto and off of the lift mechanism pins, by way of a robotic mechanism including a robot blade or fork at the end of a robotic arm.

Retention of the wafer to the pedestal while in the chamber may be accomplished mechanically by an edge ring. Alternatively, retention of the wafer to the pedestal while in the chamber may be accomplished electrostatically by an electrostatic chuck.

Wafers tend to be relatively brittle and susceptible to damage anytime one is handled or manipulated. For example, during a loading sequence into the chamber, contact of the pins with the wafer may be undesirably harsh thus damaging the wafer as transfer from the robot blade to the pins is accomplished. A wafer may also become mispositioned with respect to the pins when engagement therewith is undesirably harsh. A wafer mispositioned with respect to the pins will also be mispositioned when it is brought into contact with the pedestal. Likewise, contact of the wafer with the pedestal may also be undesirably harsh thus damaging the wafer as transfer from the pins to the pedestal is accomplished. With mechanical edge ring retention, damage to the wafer may result from excessive clamping forces. Similarly, damage may occur to the wafer upon the unloading of the wafer from the chamber. Late release of a mechanical edge ring or residual charge in an electrostatic chucking mechanism may result in damaged wafers if the pins attempt to separate the wafer from the pedestal prior to its complete release therefrom. If the retention force is great enough the wafer may break before release. The wafer may also break if it releases with a spring action and bounces. A wafer may also become mispositioned with respect to the pins during such a release. Apart from late or incomplete release of the wafer from the pedestal, contact of the pins with the wafer may be undesirably harsh during unimpeded separation of the wafer from the pedestal thus damaging the wafer. A wafer may also become mispositioned with respect to the pins during such a harsh contacting. Pin travel during separation of the wafer from the pedestal in preparation for transfer to the robot blade may reach the travel limit undesirably abruptly resulting in breakage of the wafer or mispositioning upon the pins as the wafer bounces upon the pins. Mispositioning upon the pins may result in mispositioning upon the robot blade which may in turn result in damage of the wafer as it is removed from the chamber through the access slot or thereafter in a subsequent transfer from the robot blade. Mispositioning upon the pins wherein the wafer is partially supported by the pins and the pedestal might also result in damage or breakage of the wafer when the robot blade enters the chamber to retrieve the wafer.

An operator may never be alerted to the various situations outlined above in a conventionally automated process resulting in wasteful utilization of chamber processing time on a broken or damaged wafer or on a wafer that is mispositioned on the pedestal. A wafer broken upon its loading into the chamber would desirably not be processed. Unbroken but mispositioned wafers may be subject to much lower yields due to edge effects, for example, in a sputtering process that could be avoided if the wafer were removed from the chamber and properly loaded. A wafer that is broken into several pieces, whether broken pre or post chamber processing, might not be removed from the chamber at all thus resulting in wafer debris within the chamber during further attempted wafer processing.

Therefore from the above, it is apparent that the need exists for detection of conditions within the chamber indicative of broken or out of position wafers. Such detection is advantageous at various points in the chamber processing. Of particular benefit is such detection subsequent to wafer transfer into the chamber but prior to chamber processing, and such detection subsequent to chamber processing but prior to wafer transfer out of the chamber.

SUMMARY OF THE INVENTION

Therefore, it is one object of the present invention to detect broken or out of position wafers within a processing chamber.

It is a further object of the present invention to provide such detection capabilities prior to and subsequent to wafer processing within the chamber.

In accordance with these and other objects of the invention, a microchip fabrication apparatus for processing a wafer comprises a chamber for processing the wafer, a plurality of lift mechanism pins within the chamber for supporting the wafer, and a plurality of sensors associated with said pins for detecting the wafer position.

Preferably, sensing is accomplished by capacitive means. Alternative sensing means associated with the lift mechanism pins, such as optical sensing, is envisioned.

A method of detecting an out of position wafer in a microchip fabrication chamber including a pedestal adapted for retention of a wafer thereto and a plurality of lift mechanism pins adapted to effect wafer to pedestal disengagement and engagement comprises the steps of providing wafer sensing means associated with at least one of said plurality of lift mechanism pins, and during a period when the lift mechanism pins are in a wafer disengaged position relative to the pedestal, sensing the presence of the wafer with respect to the at least one of the plurality of lift mechanism pins having the wafer sensing means.

BRIEF DESCRIPTION OF THE DRAWINGS

The present invention will now be described, by way of example, with reference to the accompanying drawings, in which:

FIG. 3 illustrates a view of the chamber and mispositioned wafer of FIG. 2 taken in the direction indicated by line 3—3;

FIG. 4 illustrates a partial sectional view of an exemplary lift pin in accordance with one implementation of the present invention;

FIG. 5 illustrates a view of the end of the exemplary lift pin of FIG. 4 taken in the direction indicated by line 5—5;

FIG. 6 illustrates an exemplary block diagram of chamber/controller interface circuitry for detecting and indicating mispositioned and broken wafers;

FIG. 7 illustrates a logic table representing the correspondence between various individual pin conditions and fault indications;

DESCRIPTION OF THE PREFERRED EMBODIMENT

Figure 1:
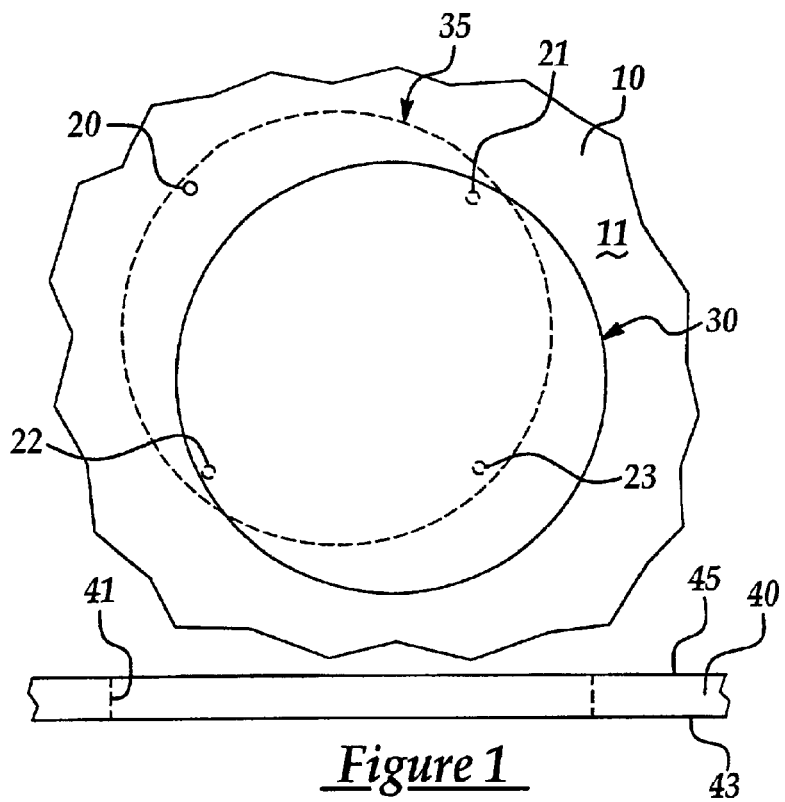
FIG. 1 illustrates a top view of a portion of a microchip fabrication chamber and first mispositioned wafer.
Figure 2:
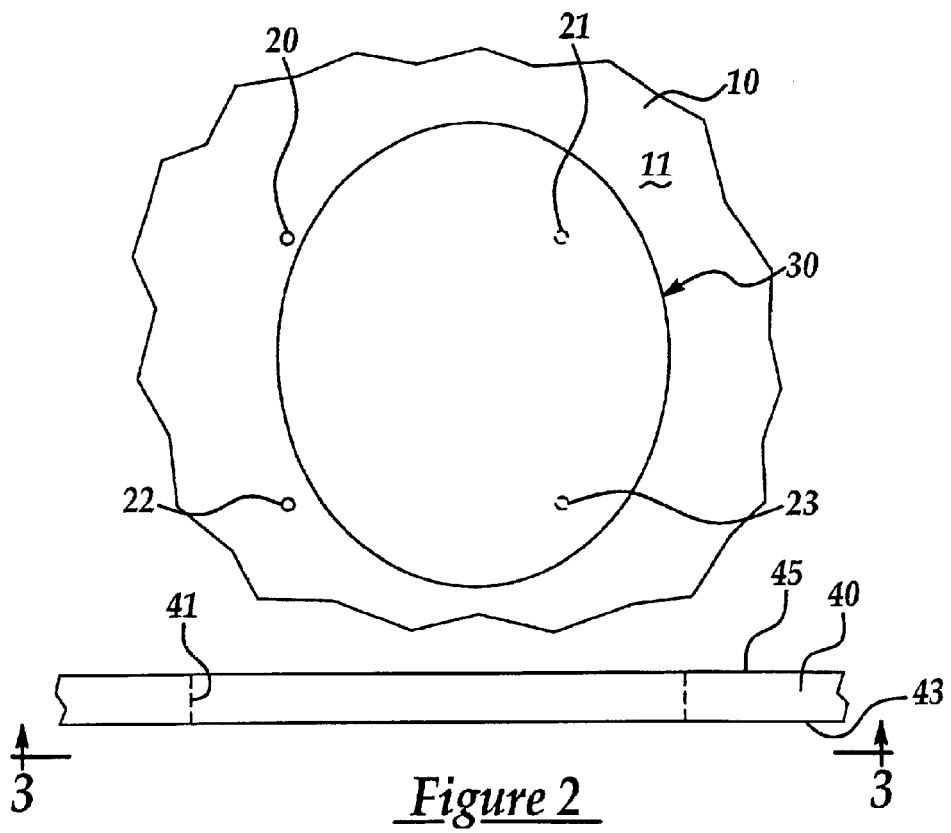
FIG. 2 illustrates a top view of a portion of a microchip fabrication chamber and second mispositioned wafer.

In FIGS. 1 through 3 a variety of reference numerals are repeated in reference to the same features of a typical microchip fabrication chamber. Only those portions of the chamber and lift mechanism required for a complete understanding of the present invention are disclosed in the Figures for clarity.

The chamber includes a side 40 having inner and outer surfaces 45 and 43, respectively, and a slot 41 therethrough for providing access to a robotic blade carried by an articulated robotic arm (not illustrated) as well known to those skilled in the art. The robotic blade during load and unload sequences be commanded by a controller to reach through the slot 41 into the chamber. During a normal load sequence, the robotic blade would carry a wafer to be processed into the chamber whereat the lift mechanism pins would move up from beneath the wafer, clearing the robotic blade and lifting the wafer therefrom. The lift pin mechanism, too, is commanded by the controller. Proper, desired positioning of a wafer is illustrated by broken line 35 in FIG. 1. The robotic blade would then be retracted where after the wafer would be brought into contact with the top surface 11 of the pedestal 10. During a normal unload sequence subsequent to processing, the wafer would be separated from the pedestal 10 as the pins breach through the top surface 11 thereof. The pins would reach an end of travel where after the robotic blade would be commanded by the controller to reach through the slot 41 into the chamber beneath the wafer. The pins would retract and transfer the wafer to the robotic arm where after it would remove the processed wafer from the chamber.

With reference first to the illustrative mispositioning of FIG. 1, the chamber contains a mispositioned wafer 30. A properly positioned wafer would be symmetrically disposed with respect to the lift mechanism pins 20, 21, 22, 23 as shown by broken line 35. The present exemplary chamber is shown having four lift mechanism pins. At a minimum three pins are required. Other numbers of pins may be employed. With the pins 20 through 23 in a retracted position, the wafer 30 lies with its back surface 31 in contact with the top surface 11 of pedestal 10. With the pins 21 through 23 extended through the pedestal 10 beyond the top surface 11, the back surface 31 of wafer 30 is in intimate contact with pins 21 through 23. Pin 20 is not in contact with the back surface 31 of wafer 30. Top surface 33 of wafer 30 is the side of the wafer desirably processed.

It is apparent from the illustrated mispositioning of FIG. 1 that a wafer so disposed may be subject to damage by the retention mechanism at the pedestal and improper processing. Additionally, the wafer may interfere with the slot 41 upon removal by the robotic blade.

With reference first to the illustrative mispositioning of FIGS. 2 and 3, the chamber contains a mispositioned wafer 30. The chamber is in all respects the same as the chamber described with respect to FIG. 1. The wafer 30, however, exhibits an alternate mispositioning. The wafer 30 is shown only partially supported by the pins. The tips of pins 21 and 23 are in contact with wafer 30 while the tips of pins 20 and 22 are not in contact with wafer 30. This mispositioning is more clearly shown in the side view of FIG. 3 taken in the direction indicated by line 3—3 of FIG. 2. In the view of FIG. 3, it can be seen that the wafer 30 rests partially on the tips of pins 21 and 23 and partially on the top surface 11 of pedestal 10. If this type of mispositioning is the result of a faulty load sequence, then retraction of the pins will result in corresponding mispositioning of the wafer 30 upon the pedestal 10. If this type of mispositioning is the result of a faulty unload sequence, then the robotic blade may impinge upon the wafer and destroy it upon attempted retrieval.

In yet a more catastrophic mispositioning, the wafer may be broken into two or more pieces resulting in less than all of the lift mechanism pins being in contact with the wafer or none of the pins being in contact with any of the wafer. A broken wafer is not separately illustrated herein as the effects of such mispositioning can be fully understood with reference to the previously described mispositionings and the subsequent description of their detection.

Any one pin that is not in contact with the wafer indicates a mispositioning of the wafer that may require process intervention by the operator or the process controller. With reference to FIG. 7, a logic table illustrates possible wafer status down the far left column labeled "Wafer Status." Columns labeled P1, P2, P3 and P4 correspond to each of four pins in an exemplary four pin lift mechanism. A "0" in the P1 through P4 columns represents the corresponding pin is not in contact with the wafer. A "1" in the P1 through P4 columns represents the corresponding pin is in contact with the wafer. An "X" in the P1 through P4 columns represents irrelevance of whether the corresponding pin is in contact with the wafer or not for the particular wafer status in the far left column. The far right column labeled "Fault" represents a single-bit binary indication of whether the wafer status is proper "1" (as indicated by all pins in contact with the wafer) or improper "0" (as indicated by any one pin not in contact with the wafer). A preferred manner of sensing pin contact with a wafer is by way of capacitive proximity sensing. Alternative sensing may also be employed such as, for example, optical sensing.

Pairs of pins may be monitored for fault conditions also. FIG. 6 illustrates a block diagram of an exemplary circuit for capacitively sensing the wafer and indicating a normal or fault condition with a binary signal. Rather than the exemplary capacitive proximity sensing as previously described with respect to individual pin sensing the circuitry of FIG. 6 senses capacitance between pairs of pins. Each pin in a four pin lift mechanism is provided with a probe electrode 61, 63, 65, 67 substantially at each respective tip. Capacitance between pairs of electrodes 61,63 and 65,67 are detected by conventional capacitive sense circuits C1 70 and C2 71, respectively. Experimental results have confirmed that a capacitance of substantially 0 picofarads between pairs of pins that are not commonly coupled to the bottom of a wafer results, whereas a capacitance of substantially 40 picofarads between pairs of pins that are commonly coupled to the bottom of a wafer results. The output lines 75 and 73 of capacitive sense circuits C1 70 and C2 71, respectively, provide a binary signal 0 to indicate that at least one of the pins of the respective pair of pins is not coupled to the bottom of a wafer and a 1 to indicate that both of the pins of the respective pair of pins are commonly coupled to the bottom of a wafer. These output line states can be viewed in the columns of the logic table of FIG. 8 labeled C1 and C2. Any time either of C1 or C2 returns an indication that the respective pin pair is not commonly coupled to the bottom of a wafer (i.e. 0), a fault is indicated. A broken or missing wafer will likely result in both C1 and C2 indicating that both pin pairs are not commonly coupled to the bottom of a wafer. Proper wafer positioning will result in a capacitance measurement between both pin pairs with both C1 and C2 returning a 1 on lines 75 and 73. Lines 75 and 73 are coupled into a digital comparator to provide a single bit binary output to indicate a fault (0) or normal condition (1). This single bit binary output may be used to provide operator warning in the event of a fault, provide a lockout to further automated processing until the fault condition is rectified.

FIGS. 4 and 5 illustrate one exemplary embodiment of a pin arrangement adapted for capacitive sensing wherein each pin 50 has a central longitudinal bore 53 through which a probe electrode 55 is disposed. An insulative layer 59 is located between the central electrode 55 and the outer core 51 of the pin 50 if the pin is itself conductive. Electrode 55 is exposed at the tip 57 of pin 50 such that it is proximate the underside or bottom of the wafer and preferably in contact therewith when the wafer is carried by the pin 50.

Figures 8, 9, 10:
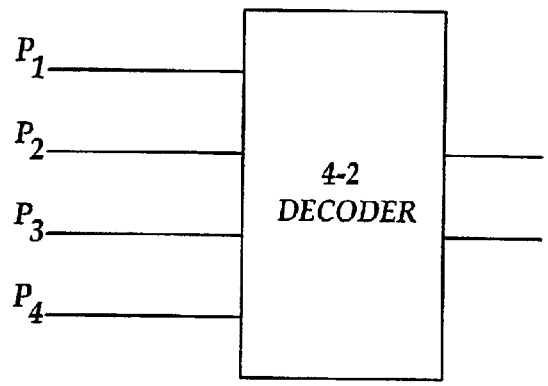
FIG. 8 illustrates a logic table representing the correspondence between various pin pair conditions and fault indications achievable with the exemplary block diagram of chamber/controller interface circuitry for detecting and indicating mispositioned and broken wafers as illustrated in FIG. 6.
FIG. 9 is a block diagram of a 4 to 1 decoder for translating various combinations of individual pin conditions to a two-bit binary representation of particular faults.
FIG. 10 illustrates a logic table representing the correspondence between various combinations of individual pin conditions to a two-bit binary representation of particular faults achievable by a decoder as exemplified in FIG. 9.

With reference now to FIGS. 9 and 10, an alternative embodiment of an individual pin sensing arrangement is described. In this embodiment, additional information is extracted from the sensed condition at the four pins by a 4 to 1 decoder of FIG. 9 exhibiting the binary logic outputs shown down the far right column labeled FAULT corresponding to the sensed conditions at the four pins shown down the columns labeled P1 through P4 in FIG. 10. An X in any position indicates that for the particular fault being decoded the sensed condition of the corresponding pin is not relevant (unless a higher priority fault may be indicated).

It is possible to establish a hierarchy or priority and fault type based upon the sensed pin conditions. For example, a broken or missing wafer is indicated by the binary pair 1/1 and is a high priority fault of a first type that may indicated. A wafer that is partially supported by two pins and partially supported by the pedestal (FIGS. 2 and 3) indicated by the binary pair 1/0 is a high priority fault of a second type that may be indicated. In both cases the first bit of the binary pair indicates the priority and the second bit indicates the type of fault. Both such faults are likely to require immediate operator intervention and hence the high priority bit may be utilized to require operator intervention in the process by providing a lock-out of further processing steps and notification to the operator. Similarly, a wafer that is fully supported by three pins is indicated by the binary pair 0/1 while a properly positioned wafer is indicated by the binary pair 0/0. In these two cases, the first bit of the binary pair indicated the priority and the second bit indicated the type of fault or absence of a fault. In certain chamber processes it may be acceptable to allow a slightly mispositioned wafer to undergo the chamber processing but require operator intervention upon its removal. Hence, the mispositioned wafer indicated by the low priority/mispositioned binary pair 0/1 may be allowed to proceed through processes but require operator intervention upon its removal only.

The previous embodiments have been described in detail with respect to a four pin apparatus. It is intended that the invention may be practiced with more or less pins. Additionally, the embodiments have been described wherein all pins have associated therewith a sensor element for use in the detection of the wafer. However, it is intended that the invention encompasses apparatus wherein fewer than all of the pins in the apparatus have an associated sensor element.

The invention has been described with respect to certain preferred embodiments intended to be taken by way of example and not by way of limitation. Certain alternative implementations and modifications may be apparent to one exercising ordinary skill in the art. Therefore, the scope of invention as disclosed herein is to be limited only with respect to the appended claims.

The invention in which an exclusive property or privilege is claimed are defined as follows:

What is claimed is:

1. Micro chip fabrication apparatus for processing a wafer comprising:
    a chamber for processing the wafer,
    a plurality of pairs of lift mechanism pins within the chamber for supporting the wafer and
    a plurality of capacitive proximity sensors disposed substantially at a tip of each of said plurality of lift mechanism pins for detecting the wafer position
    wherein;
        the pairs of the plurality of capacitive proximity sensors are configured to detect a capacitance between an associated pair of lift mechanism pins.

2. The apparatus as claimed in claim 1 wherein; each of the plurality of capacitive proximity sensors detects the wafer in cooperation with an associated lift mechanism pin.

3. The apparatus as claimed in claim 1 wherein the tip of at least one of said plurality of lift mechanism pins has capacitive proximity sensing means disposed substantially within the tip for detecting the proximity of the wafer.

4. The apparatus as claimed in claim 3 wherein the capacitive proximity sensing means comprise respective pins.

5. The apparatus as claimed in claim 3 wherein the capacitive proximity sensing means comprises a probe electrode through a central longitudinal bore of a respective pin, the probe electrode extending from a tip of said at least one of said plurality of lift mechanism pins.

6. The apparatus as claimed in claim 1 further comprising:
    A capacitive sense logic circuit in communication with the capacitive proximity sensor for determining if a wafer is out of position.

* * * * *